United States Patent
Mao

(10) Patent No.: US 12,416,669 B2
(45) Date of Patent: Sep. 16, 2025

(54) TEMPLATIZED MEMORY PATTERN GENERATOR AND METHOD

(71) Applicant: Macrotest Semiconductor Technology Co., Ltd, Nanjing (CN)

(72) Inventor: Guoliang Mao, Nanjing (CN)

(73) Assignee: Macrotest Semiconductor Technology Co., Ltd, Nanjing (CN)

( * ) Notice: Subject to any disclaimer, the term of this patent is extended or adjusted under 35 U.S.C. 154(b) by 0 days.

(21) Appl. No.: 18/688,393

(22) PCT Filed: Mar. 15, 2023

(86) PCT No.: PCT/CN2023/081506
§ 371 (c)(1),
(2) Date: Mar. 1, 2024

(87) PCT Pub. No.: WO2023/221620
PCT Pub. Date: Nov. 23, 2023

(65) Prior Publication Data
US 2025/0244384 A1    Jul. 31, 2025

(30) Foreign Application Priority Data
May 18, 2022   (CN) .......................... 202210537342.1

(51) Int. Cl.
*G01R 31/3181*   (2006.01)
*G01R 31/28*   (2006.01)
(Continued)

(52) U.S. Cl.
CPC ... *G01R 31/31813* (2013.01); *G01R 31/2834* (2013.01); *G01R 31/31919* (2013.01); *G06F 11/2236* (2013.01); *G11C 29/56004* (2013.01)

(58) Field of Classification Search
CPC .......... G01R 31/31813; G01R 31/2834; G01R 31/31919; G06F 11/2236; G11C 29/56004
See application file for complete search history.

(56) References Cited

U.S. PATENT DOCUMENTS 4,300,234 A * 11/1981 Maruyama ............. G11C 29/56
714/743
7,302,623 B2 11/2007 Kang
(Continued)

FOREIGN PATENT DOCUMENTS

CN    113687994 A    11/2021
CN    113722171 A    11/2021
(Continued)

OTHER PUBLICATIONS

"Programmable Test Pattern Generator and Controller" Disclosed Without Attribution IP.com No. IPCOM000255318D IP.com Electronic Publication Date: Sandeep Bhatia , Sep. 17, 2018 (Year: 2018).*

(Continued)

*Primary Examiner* — Cynthia Britt
(74) *Attorney, Agent, or Firm* — Hemisphere Law, PLLC; Zhigang Ma

(57) ABSTRACT

The templatized memory pattern generator includes a test processor, a simple memory pattern generator, a channel timing & formatter, and a pin electronic. The simple memory pattern generator includes an X address generator, a Y address generator, a D data generator, a SMPG and channel mapping. An input terminal of the channel timing & formatter is connected to the SMPG and channel mapping; and parallel data calculated by the simple memory pattern generator based on an SMPG resource mapping table provided by an upper computer is mapped to pins of a device under test one by one. The present disclosure can effectively reduce a quantity of test vectors in an image file. Meanwhile, after modulation, the scheme can improve the reusability of a test program and reduce the development period of the test scheme.

5 Claims, 9 Drawing Sheets

(51) Int. Cl.
*G01R 31/319* (2006.01)
*G06F 11/22* (2006.01)
*G11C 29/56* (2006.01)

(56) References Cited

U.S. PATENT DOCUMENTS

2006/0031725 A1* 2/2006 Kang ............... G11C 29/56012
  714/718
2006/0184849 A1* 8/2006 Morishita ............. G11C 29/48
  714/738
2022/0317185 A1* 10/2022 Ru ................... G01R 31/31718

FOREIGN PATENT DOCUMENTS

| CN | 113742260 A | 12/2021 |
| CN | 114637638 | 6/2022 |

OTHER PUBLICATIONS

International search report of PCT/CN2023/081506.

* cited by examiner

| SMPG Resource Map | | Bus Configurations | | | | Comments | |
| --- | --- | --- | --- | --- | --- | --- | --- |
| Map Name | Pin Name | Set 0 | Set 1 | Set 2 | Set 3 | | |
| MapName1 | Pin1 | X0 | X1 | X2 | X3 | Pin6 | |
| MapName1 | Pin2 | X11 | X12 | X13 | X14 | Pin7 | |
| MapName1 | Pin3 | Y13 | Y14 | Y15 | Y16 | Pin8 | |
| MapName1 | Pin4 | D22 | D23 | D24 | D25 | Pin9 | |
| MapName1 | Pin5 | D23 | D24 | D25 | D26 | Pin10 | |
| MapName2 | Pin11 | X0 | X1 | X2 | X3 | Pin16 | |
| MapName2 | Pin12 | X11 | X12 | X13 | X14 | Pin17 | |
| MapName2 | Pin13 | Y13 | Y14 | Y15 | Y16 | Pin18 | |
| MapName2 | Pin14 | D22 | D23 | D24 | D25 | Pin19 | |
| MapName2 | Pin15 | D23 | D24 | D25 | D26 | Pin20 | |

FIG. 4

TEMPLATIZED MEMORY PATTERN GENERATOR AND METHOD

TECHNICAL FIELD

The present disclosure relates to a templatized memory pattern generator and a method, and belongs to the field of such as an automatic test device for an integrated circuit, semiconductor manufacturing, instruments and apparatuses, digital signals, mixed-signal chip test, and high-speed signal detection.

BACKGROUND

In a test scenario for a memory, there are often two characteristics of testing such devices:
1. The device has many pins, mainly including address pins with wider bits and data pins with wider bits.
2. A very large amount of data needs to be tested because of the large storage capacity of the memory. All storage units need to be traversed during the test to avoid defective pixels.

A traditional test scheme is shown in FIG. 1: A pattern records level states and timing of all the pins in each cycle. A Pattern Generator (Pat Gen) is responsible for sending instructions to a Pin Gen based on the pattern. Each channel of the Pin Gen is responsible for generating a data excitation or receiving return data based on preset timing of the pattern. A pin electronic (PE) is an external device responsible for converting the received excitation data into a specified excitation level, and converting a level returned by a device under test into data. Each pin of a Device Under Test (DUT) is connected to the pin electronic.

The traditional test scheme is that the pattern is used to serially represent a test vector of the DUT, each row vector representing the level states of all the pins in a cycle. A plurality of row vectors are used to describe a complete test set for a plurality of cycles.

As the number of pins in the DUT increases and the capacity of the memory increases, the number of the test vectors will increase exponentially. Therefore, during the testing of the memory, this test method is very inefficient, and an error rate in writing and modifying patterns is extremely high. In the traditional method, the test vectors in the pattern are used to represent the level states of the pins of the DUT in each cycle. Therefore, as the number of the pins of the DUT increases and the memory capacity increases, the test vectors in the pattern will increase exponentially, which affects the test efficiency and increases the difficulty of writing and modifying the patterns.

In addition, relying solely on the patterns to statically represent the test vectors limits the reusability of the test scheme.

SUMMARY

Objectives of this invention: In order to overcome the shortcomings in the prior art, the present disclosure provides a templatized memory pattern generator and a method. The present disclosure can effectively reduce a quantity of test vectors in an image file by generating, based on an algorithm, addresses and data required by a device under test in each cycle. Meanwhile, after modulation, the scheme can improve the reusability of a test program and reduce the development period of the test scheme.

Technical solutions: In order to achieve the above objectives, the present disclosure adopts the following technical solutions:

A templatized memory pattern generator includes a test processor, a simple memory pattern generator, a channel timing & formatter, and a pin electronic, wherein the test processor includes a timing generator, a pattern generator, a simple memory pattern generator (SMPG) control instruction generator, a pattern memory, and a memory control; the memory control is respectively connected to the timing generator, the pattern generator, the SMPG control instruction generator, and the pattern memory; the pattern generator is respectively connected to the timing generator and the SMPG control instruction generator; the test processor sends a control instruction to the simple memory pattern generator;

the simple memory pattern generator includes an X address generator, a Y address generator, a D data generator, and an SMPG and channel mapping; the SMPG and channel mapping are respectively connected to the X address generator, the Y address generator, and the D data generator; the X address generator is connected to the Y address generator; an input terminal of the channel timing & formatter is connected to the SMPG and channel mapping; an output terminal of the channel timing & formatter is connected to the pin electronic; and parallel data calculated by the simple memory pattern generator based on an SMPG resource mapping table provided by an upper computer is mapped to pins of a device under test one by one.

Preferably, the SMPG resource mapping table includes MapName, PinName, a bus configurations set, and a Capture, wherein the MapName represents a mapping resource name; the PinName represents a DUT pin that needs to be mapped to SMPG parallel data; the bus configurations set defines SMPG resources mapped to the pins; and the Capture represents a DUT pin that needs to capture return data to SMPG.

Preferably, the X address generator is composed of an arithmetic logic unit ALU and a 16-bit wide X address register; the Y address generator is composed of an arithmetic logic unit ALU and a 16-bit wide Y address register; and the D data generator is composed of an arithmetic logic unit ALU and a 16-bit wide D address register.

Preferably, the X address register includes an X address preset value register Preset, an X address constant register Const, and an X address enable register Enable; and a calculation result of the X address generator is controlled by an instruction obtained by the arithmetic logic unit ALU of the X address generator and the X address preset value register Preset, the X address constant register Const, and the X address enable register Enable. The Y address register includes a Y address preset value register Preset, a Y address constant register Const, and a Y address enable register Enable; and a calculation result of the Y address generator is controlled by an instruction obtained by the arithmetic logic unit ALU of the Y address generator and the Y address preset value register Preset, the Y address constant register Const, and the Y address enable register Enable. The D address register includes a D address preset value register Preset, a D address constant register Const, and a D address enable register Enable; and a calculation result of the D data generator is controlled by an instruction obtained by the arithmetic logic unit ALU of the D data generator and the D address preset value register Preset, the D address constant register Const, and the D address enable register Enable.

Preferably, an instruction set of the test processor adopts an ATE specific instruction set.

A test method of a templatized memory pattern generator includes the following steps:

step 1, loading, by the test processor, a main pattern, generating, by the test processor, a timing and a level, and sending, by the test processor, the generated timing and level to the simple memory pattern generator;

step 2, loading, by the simple memory pattern generator the timing and the level; determining whether to start the simple memory pattern generator; if the simple memory pattern generator is started, configuring the SMPG resource mapping table for the simple memory pattern generator, and simultaneously configuring the X address preset value register Preset, the X address constant register Const, the X address enable register Enable, the Y address preset value register Preset, the Y address constant register Const, the Y address enable register Enable, the D address preset value register Preset, the D address constant register Const, and the D address enable register Enable; mapping parallel data calculated by the simple memory pattern generator to pins of a device under test one by one, and executing the pattern; if the simple memory pattern generator is not started, executing the pattern; and step 3, determining, based on a pattern execution result, whether a test succeeds.

Preferably, after whether a test succeeds is determined, an automatic test device for an integrated circuit informs handler of performing or not performing a Pass/Fail selection operation; if it is determined that the test succeeds, the automatic test device for the integrated circuit informs the handler of selecting Pass; if it is determined that the test fails, the automatic test device for the integrated circuit informs the handler of selecting Fail.

Compared with the prior art, the present disclosure has the following technical effects:

1. The present disclosure integrates an SMPG dedicated computing unit into a test processor architecture, and the test processor calculates parallel test data of the device under test in each cycle based on an algorithm and data, such as address information and data information. The pattern only needs to provide an algorithm, without characterizing level states of all the pins of the device under test in each cycle. Therefore, a quantity of test vectors in the pattern can be greatly reduced, the accuracy and efficiency of test are improved, and the difficulty of writing and modifying the pattern is lowered.

2. The present disclosure provides a templatized solution. In practical use, a user can complete a basic memory test by only configuring the resource mapping table and three registers Preset, Const, and Enable of the SMPG address or data generator. The reusability of the solution is improved, and the development period is reduced.

BRIEF DESCRIPTION OF THE DRAWINGS

FIG. 4 is an SMPG resource mapping table.

DETAILED DESCRIPTION OF THE EMBODIMENTS

Based on the accompanying drawings and specific embodiments, the present disclosure will be further elaborated. It should be understood that these examples are only used to illustrate the present disclosure and not to limit the scope of the present disclosure. After reading the present disclosure, modifications to various equivalent forms of the present disclosure by those skilled in the art shall all fall within the scope defined by the claims attached to the present disclosure.

Figure 1:
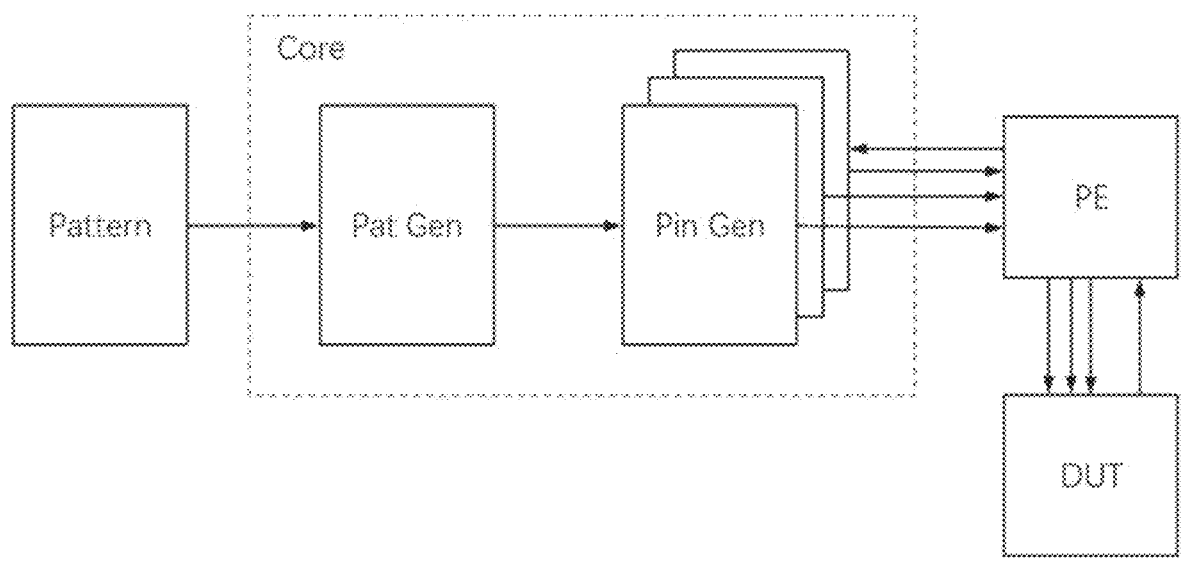
FIG. 1 is an existing memory test scheme.
Figure 2:
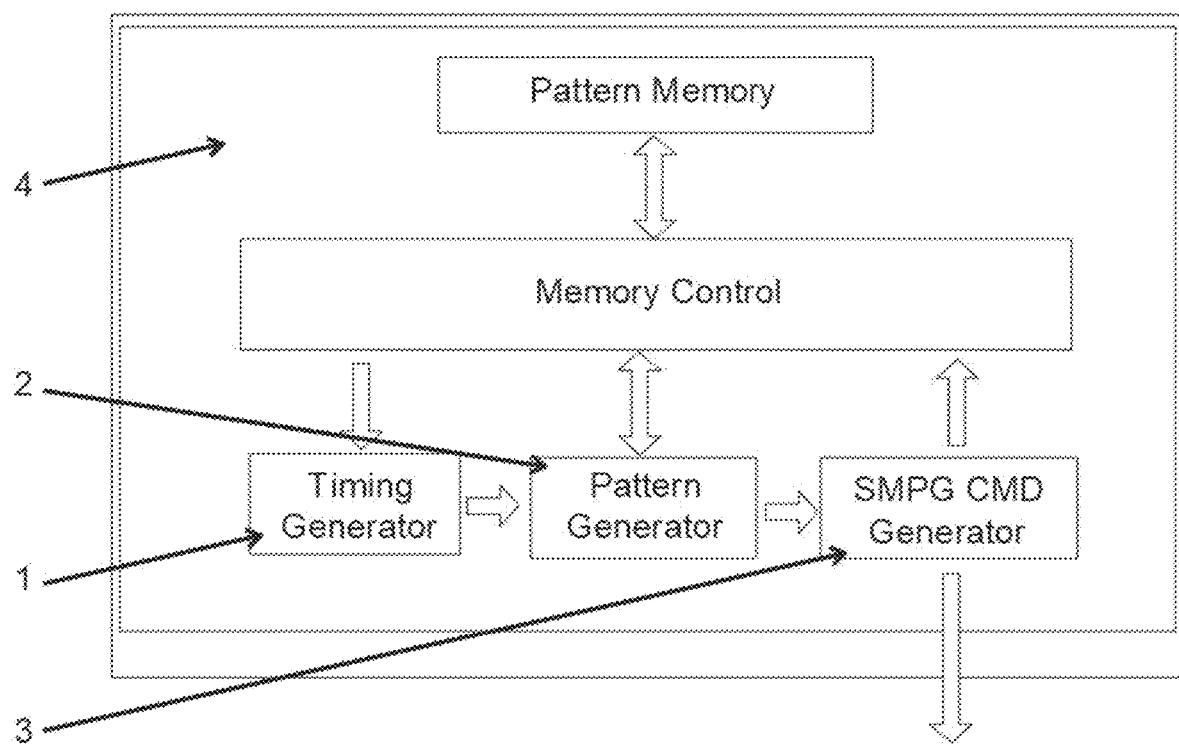
FIG. 2 is a schematic diagram of an internal structure of a test processor.

A templatized memory pattern generator includes a test processor 4, a simple memory pattern generator 6, a channel timing & formatter 11, and a pin electronic 12. As shown in FIG. 2, the test processor 4 includes a timing generator 1, a pattern generator 2, an SMPG control instruction generator 3, a pattern memory, and a memory control; the memory control is respectively connected to the timing generator 1, the pattern generator 2, the SMPG control instruction generator 3, and the pattern memory; the pattern generator 2 is respectively connected to the timing generator 1 and the SMPG control instruction generator 3; and the test processor 4 sends a control instruction to the simple memory pattern generator 6.

The Timing Generator 1 (TG) is configured to generate precise timing signals (including a cycle, a time edge, and the like) required by each cycle according to a timing requirement specified by the pattern.

The pattern generator 2 is configured to generate a control timing (including jump, loop, and the like) required by pattern test according to an instruction requirement of the pattern.

The SMPG control instruction generator 3 is configured to generate, based on a pattern control requirement, an instruction signal for synchronously controlling an SMPG.

The test processor (TP) 4 is configured to execute a main pattern, including: sequential execution of pattern vectors, jumps, loops, and the like, and then send a control instruction to the simple memory pattern generator. The pattern memory stores a compiled pattern code. The timing generator 1, the pattern generator 2, and the SMPG control instruction generator 3 access the pattern memory through the memory control to obtain instructions and data. The timing generator 1 is responsible for generating information such as a corresponding cycle and a time edge for a current cycle, and providing the information to other modules. The pattern generator 2 is responsible for executing the instruction requirement in the pattern, implementing jumps, loops, and the like, and controlling the memory control to access to an address of the pattern memory. The SMPG control instruction generator 3 sends a test subsystem control instruction to a corresponding subsystem under the control of the pattern generator 2, which achieves synchronous control of the subsystem. The test processor 4 is a typical processor with a Von Neumann structure, but the instruction set uses an ATE specific instruction set, which is specifically configured to process signals rather than data.

Figure 3:
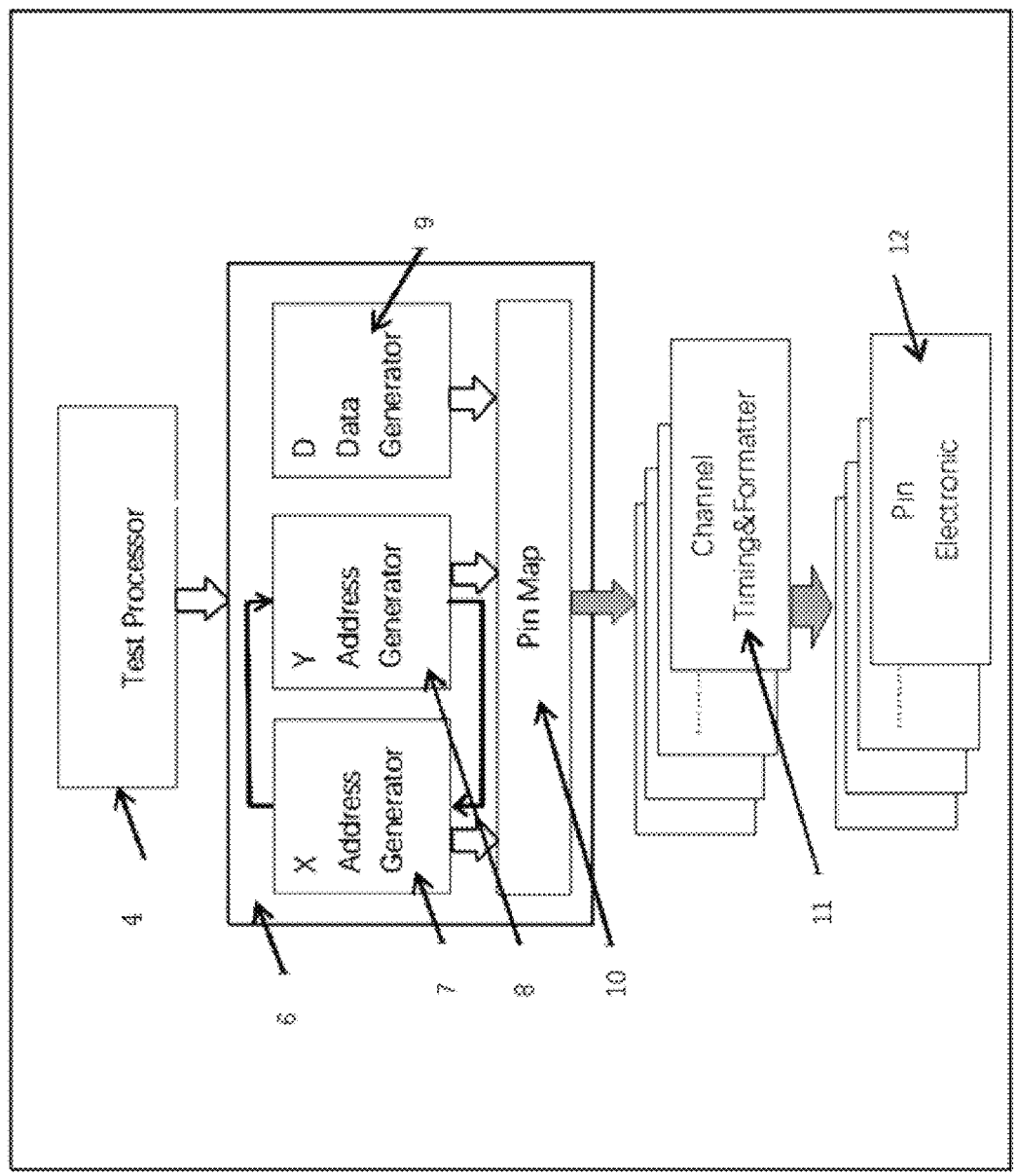
FIG. 3 is a schematic diagram of a test architecture and an SMPG.

As shown in FIG. 3, the idea of the simple memory pattern generator (SMPG) is to integrate a specific computing unit into the test processor. The upper computer and the pattern only need to be configured with the initial data and algorithm of the computing unit separately. The test processor calculates parallel test data of the device under test in each cycle based on an algorithm and data, such as address information and data information. The simple memory pattern generator will calculate the parallel data required by the device under test in each cycle based on the instruction output by the test processor, and map data bits of these parallel data to the pins of the device under test one by one through a pin mapping unit of the SMPG.

The simple memory pattern generator is configured to control various internal addresses based on the instruction of the test processor, and a data generator generates a required address and data. The simple memory pattern generator 6 includes an X address generator 7, a Y address generator 8, a D data generator 9, and an SMPG and channel mapping 10. The SMPG and channel mapping 10 are respectively connected to the X address generator 7, the Y address generator 8, and the D data generator 9, and the X address generator 7 is connected to the Y address generator 8. An input terminal of the channel timing & formatter 11 is connected to the SMPG and channel mapping 10, an output terminal of the channel timing & formatter 11 is connected to the pin electronic 12.

The X address generator (XAG) 7 is composed of an arithmetic logic unit ALU and a 16-bit wide X address register.

The Y address generator (YAG) 8 is composed of an arithmetic logic unit ALU and a 16-bit wide Y address register.

The D address generator (DDG) 9 is composed of an arithmetic logic unit ALU and a 16-bit wide D address register.

The SMPG and channel mapping 10 is configured to establish a mapping relationship between an output of the SMPG and a channel.

The channel timing & formatter 11 (CTF) is configured to convert a data output of the SMPG into a channel waveform output.

Each pin electronic 12 (PE) is composed of a digital level driver, a window comparator, a dynamic load generator, a precision current source, and the like. Each PE outputs a corresponding digital test timing signal based on the control of the CTF.

The upper computer specifies, based on the SMPG resource table, which DUT pin the parallel data (an X address, a Y address, and D data) calculated by the SMPG is mapped to, and which DUT pin returns the data to the SMPG. The SMPG resource mapping table is as shown in FIG. 4. Preferably, the SMPG resource mapping table includes MapName, PinName, a bus configurations set, and a Capture, wherein the MapName represents a mapping resource name; the PinName represents a DUT pin that needs to be mapped to SMPG parallel data; the bus configurations set (0 to 3) defines SMPG resources X0-X15, Y0-Y15, and D0-D31 mapped to the pins; and the Capture represents a DUT pin that needs to capture return data to SMPG.

Figure 5:
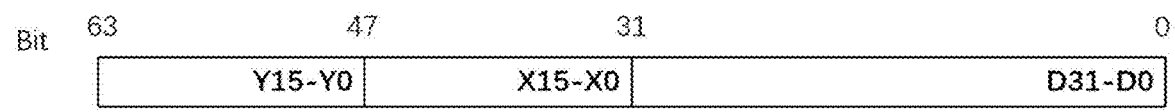
FIG. 5 is an SMPG 64 Bit parallel data.

In the simple memory pattern generator 6, a PIN_MAP (a pin mapping unit) will map, based on the SMPG resource mapping table provided by the upper computer, 64 Bit parallel data calculated by the ALU to the pins of the DUT one by one. Usually, an address pin of the DUT is mapped to high 32 Bit, and a data pin of the DUT is mapped to low 32 Bit. That is, parallel data calculated by the simple memory pattern generator 6 based on the SMPG resource mapping table provided by the upper computer is mapped to the pins of the DUT one by one. The parallel data calculated by an ALU is as shown in FIG. 5.

Figure 6:
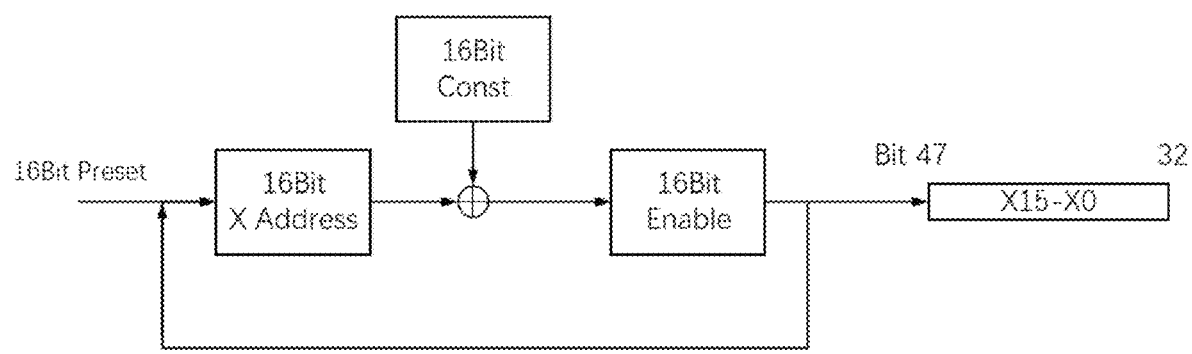
FIG. 6 is a schematic diagram of operation of an X address generator.

The 64 Bit parallel data of the SMPG is calculated and generated by three generators based on instructions received by the ALU. The three generators refer to the X address generator 7, the Y address generator 8, and the D data generator 9, and the ALU refers to an arithmetic and logic unit. Calculation results of the generators can be controlled by the instructions obtained by the current ALU and the three registers, namely a preset value register Preset, a constant register Const, and an enable register Enable. The X address generator is taken as an example. As shown in FIG. 6, the X address generator includes an X address preset value register Preset, an X address constant register Const, and an X address enable register Enable. A calculation result of the X address generator 7 is controlled by the instruction obtained by the ALU of the X address generator, and the X address preset value register Preset, the X address constant register Const, and the X address enable register Enable.

An initial operation X address register will load the 16 Bit Preset register as an initial value. For each cycle later, the 16 Bit X address register can be processed using different algorithms such as self adding, self adding, adding, or subtracting the value of the 16 Bit Const register. Finally, an enable bit of an upper 16 Bit Enable register is output as a result to the 32th bit to 47th bit of the parallel data of the SMPG, and is also used as an input value for a next cycle of operation.

The Y address register includes a Y address preset value register Preset, a Y address constant register Const, and a Y address enable register Enable. A calculation result of the Y address generator 8 is controlled by the instruction obtained by the ALU of the Y address generator, and the Y address preset value register Preset, the Y address constant register Const, and the Y address enable register Enable. The D address register includes a D address preset value register Preset, a D address constant register Const, and a D address enable register Enable. A calculation result of the D data generator 9 is controlled by the instruction obtained by the ALU of D data generator, and the D address preset value register Preset, the D address constant register Const, and the D address enable register Enable.

Figure 7:
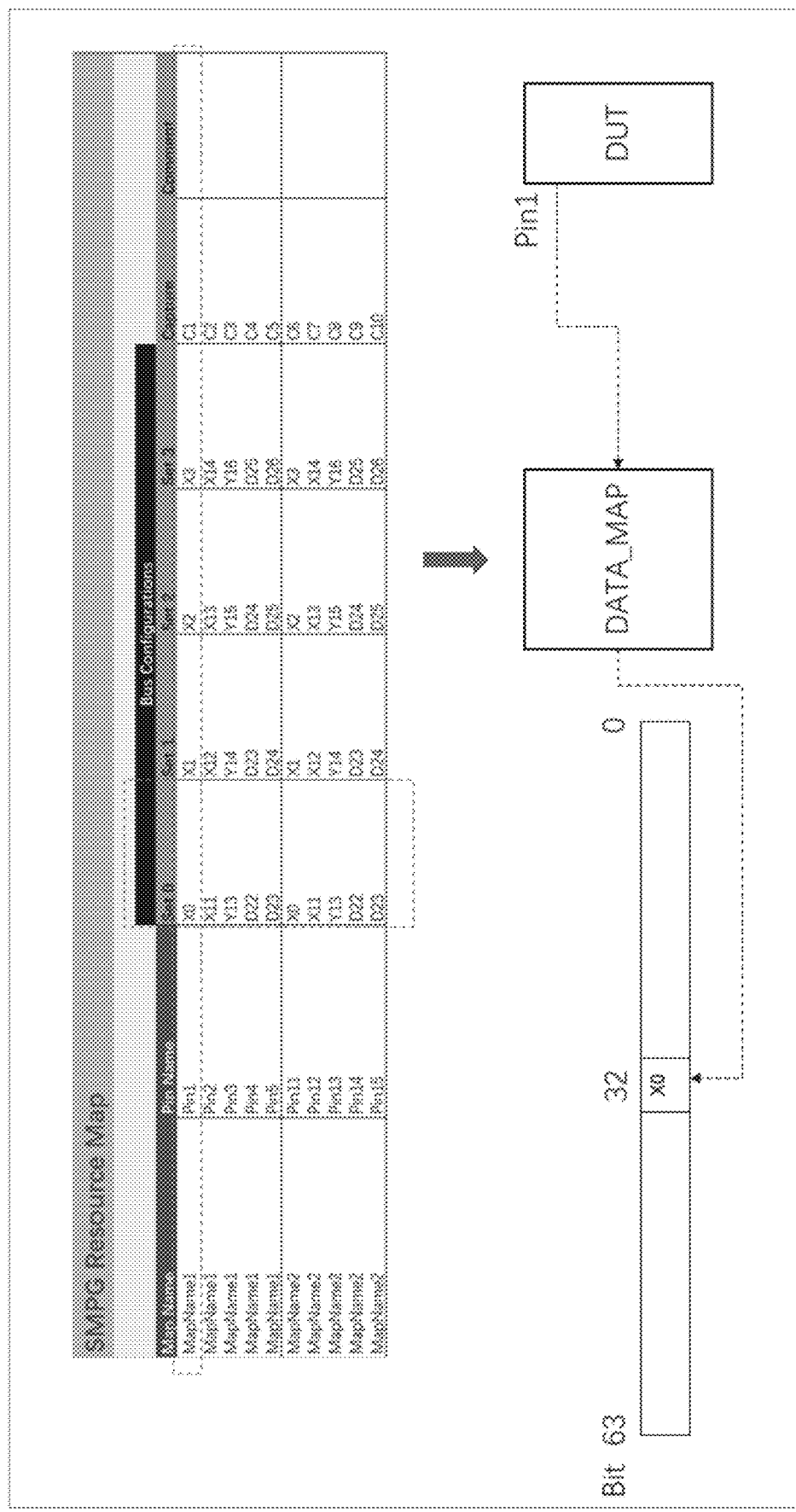
FIG. 7 is a schematic diagram of SMPG resource map.

As mentioned above, for example, if a mapping resource "MapName1" and the bus configurations set "Set0" are selected, a final DUT pin "Pin1" will ultimately be mapped by a DATA MAP to the 32nd bit "X0" of the parallel data, as shown in FIG. 7.

In practical applications, this technical solution can be templatized to improve its reusability.

Figure 8:
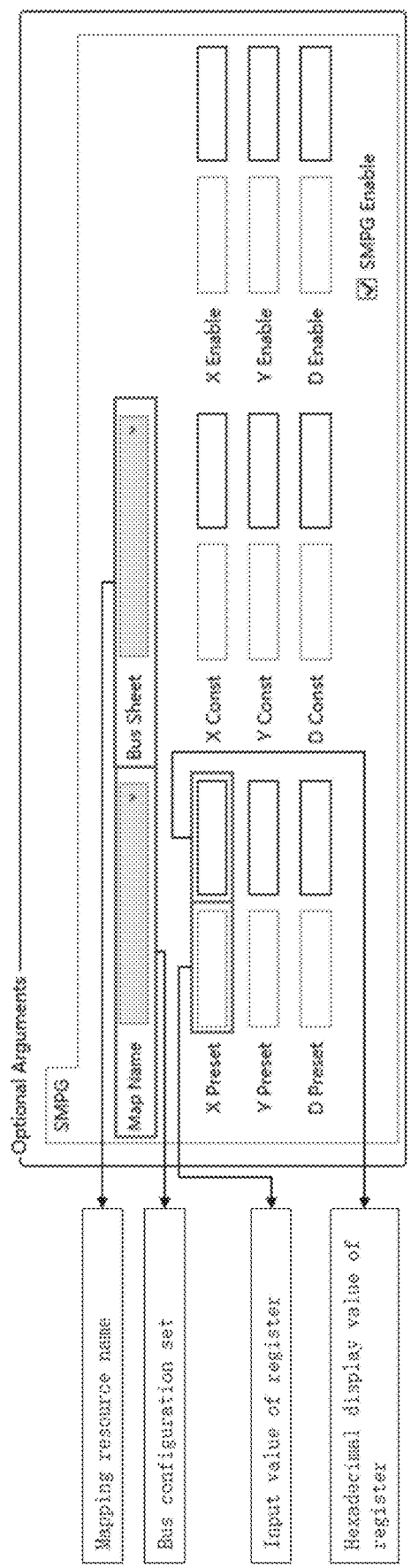
FIG. 8 is an SMPG template interface.

A user only needs to specify some basic parameters, such as the mapping resource name and the bus configurations set, and configure the initial values of the Preset, Const, and Enable registers of the internal generators of the SMPG to complete a memory test, as shown in FIG. 8.

Figure 9:
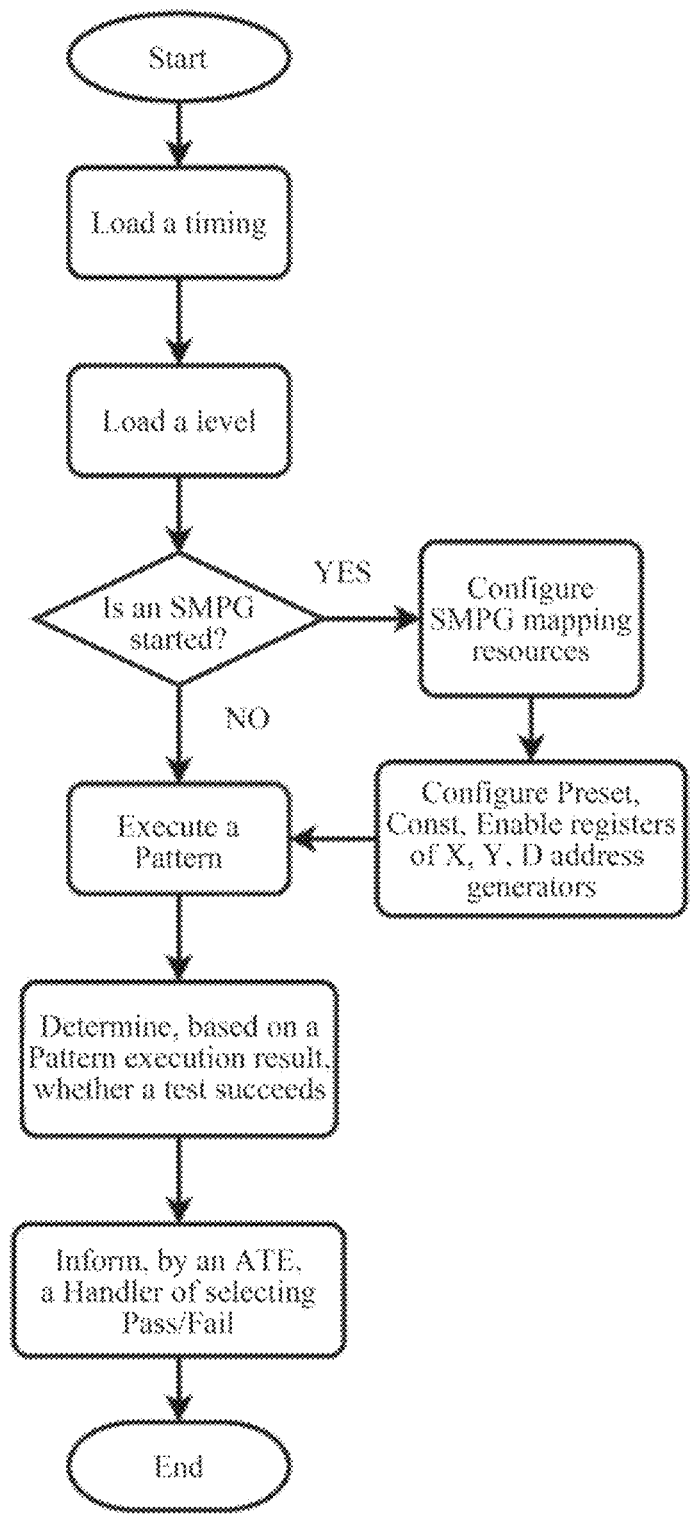
FIG. 9 is a flowchart of a test.

According to a test method of a templatized memory pattern generator, as shown in FIG. 9, before a pattern is executed, if an SMPG function is started, a system will configure an SMPG pin mapping unit according to an SMPG resource mapping table, and then an upper computer will configure initial values of Preset, Const, and Enable registers required by calculation of internal generators X, Y, and D for an SMPG calculation unit. After the execution of the pattern is completed, a selection machine will perform Pass/Fail selection on a device under test based on a test result. The following steps are specifically included:

step 1, loading, by the test processor 4, a main pattern, generating, by the test processor 4, a timing and a level, and sending, by the test processor 4, the generated timing and level to the simple memory pattern generator 6;

step 2, loading, by the simple memory pattern generator 6, the timing and the level; determining whether to start the simple memory pattern generator 6; if the simple memory pattern generator 6 is started, configuring the SMPG resource mapping table for the simple memory pattern generator 6, and simultaneously configuring the X address preset value register Preset, the X address constant register Const, the X address enable register Enable, the Y address preset value register Preset, the Y address constant register Const, the Y address enable register Enable, the D address preset value register Preset, the D address constant register Const, and the D address enable register Enable; mapping parallel data calculated by the simple memory pattern generator 6 to pins of a device under test one by one, and executing the pattern; if the simple memory pattern generator 6 is not started, executing the pattern;

step 3, determining, based on a pattern execution result, whether a test succeeds; and step 4, after whether a test succeeds is determined, informing, by an automatic test device for an integrated circuit, handler of performing or not performing a Pass/Fail selection operation; if it is determined that the test succeeds, informing, by the automatic test device for the integrated circuit, the handler of selecting Pass; and if it is determined that the test fails, informing, by the automatic test device for the integrated circuit, the handler of selecting Fail.

The foregoing descriptions are preferable implementations of the present disclosure only. It is noted that a person of ordinary skill in the art may make some improvements and modifications without departing from the principle of the present disclosure and the improvements and modifications shall fall within the protection scope of the present disclosure.

What is claimed is:

1. A templatized memory pattern generator, comprising a test processor (4), a simple memory pattern generator (6), a channel timing & formatter (11), and a pin electronic (12), wherein the test processor (4) comprises a timing generator (1), a pattern generator (2), a simple memory pattern generator (SMPG) control instruction generator (3), a pattern memory, and a memory control; the memory control is respectively connected to the timing generator (1), the pattern generator (2), the SMPG control instruction generator (3), and the pattern memory; the pattern generator (2) is respectively connected to the timing generator (1) and the SMPG control instruction generator (3); the test processor (4) sends a control instruction to the simple memory pattern generator (6);

the simple memory pattern generator (6) comprises an X address generator (7), a Y address generator (8), a D data generator (9), and an SMPG and channel mapping (10); the SMPG and channel mapping (10) are respectively connected to the X address generator (7), the Y address generator (8), and the D data generator (9); the X address generator (7) is connected to the Y address generator (8); an input terminal of the channel timing & formatter (11) is connected to the SMPG and channel mapping (10); an output terminal of the channel timing & formatter (11) is connected to the pin electronic (12);

the X address generator (7) is composed of an arithmetic logic unit ALU and a 16-bit wide X address register; the Y address generator (8) is composed of an arithmetic logic unit ALU and a 16-bit wide Y address register; the D data generator (9) is composed of an arithmetic logic unit ALU and a 16-bit wide D address register;

the X address register comprises an X address preset value register Preset, an X address constant register Const, and an X address enable register Enable; a calculation result of the X address generator (7) is controlled by an instruction obtained by the arithmetic logic unit ALU of the X address generator and the X address preset value register Preset, the X address constant register Const, and the X address enable register Enable; the Y address register comprises a Y address preset value register Preset, a Y address constant register Const, and a Y address enable register Enable; a calculation result of the Y address generator (8) is controlled by an instruction obtained by the arithmetic logic unit ALU of the Y address generator and the Y address preset value register Preset, the Y address constant register Const, and the Y address enable register Enable; the D address register comprises a D address preset value register Preset, a D address constant register Const, and a D address enable register Enable; a calculation result of the D data generator (9) is controlled by an instruction obtained by the arithmetic logic unit ALU of the D data generator and the D address preset value register Preset, the D address constant register Const, and the D address enable register Enable; and parallel data calculated by the simple memory pattern generator (6) based on an SMPG resource mapping table provided by an upper computer is mapped to pins of a device under test one by one.

2. The templatized memory test graph generator according to claim 1, wherein the SMPG resource mapping table comprises MapName, PinName, a bus configurations set, and a Capture, wherein the MapName represents a mapping resource name; the PinName represents a DUT pin that needs to be mapped to SMPG parallel data; the bus configurations set defines SMPG resources X0-X15, Y0-Y15, and D0-D31 mapped to the pins; and the Capture represents a DUT pin that needs to capture return data to SMPG.

3. The templatized memory pattern generator according to claim 2, wherein an instruction set of the test processor (4) adopts an ATE specific instruction set.

4. A test method based on the templatized memory pattern generator according to claim 1, comprising the following steps:

step 1, loading, by the test processor (4), a main pattern, generating, by the test processor (4), a timing and a level, and sending, by the test processor (4), the generated timing and level to the simple memory pattern generator (6);

step 2, loading, by the simple memory pattern generator (6) the timing and the level; determining whether to start the simple memory pattern generator (6); if the simple memory pattern generator (6) is started, configuring the SMPG resource mapping table for the simple memory pattern generator (6), and simultaneously configuring the X address preset value register Preset, the X address constant register Const, the X address enable register Enable, the Y address preset value register Preset, the Y address constant register Const, the Y address enable register Enable, the D address preset value register Preset, the D address constant register Const, and the D address enable register Enable; mapping parallel data calculated by the simple memory pattern generator (6) to pins of a device under test one by one and executing the pattern; if the simple memory pattern generator (6) is not started, executing the pattern; and step 3, determining, based on a pattern execution result, whether a test succeeds.

5. The test method according to claim 4, wherein after whether a test succeeds is determined, an automatic test device for an integrated circuit informs handler of performing or not performing a Pass/Fail selection operation; if it is determined that the test succeeds, the automatic test device for the integrated circuit informs the handler of selecting Pass; if it is determined that the test fails, the automatic test device for the integrated circuit informs the handler of selecting Fail.

* * * * *